(12) United States Patent
Sung et al.

(10) Patent No.: US 10,534,032 B2
(45) Date of Patent: Jan. 14, 2020

(54) INSULATION RESISTANCE MEASURING SYSTEM AND DEVICE

(71) Applicant: LG CHEM, LTD., Seoul (KR)

(72) Inventors: Chang Hyun Sung, Daejeon (KR); Sang Hoon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 56 days.

(21) Appl. No.: 15/559,937

(22) PCT Filed: Nov. 16, 2016

(86) PCT No.: PCT/KR2016/013185
§ 371 (c)(1),
(2) Date: Sep. 20, 2017

(87) PCT Pub. No.: WO2017/086687
PCT Pub. Date: May 26, 2017

(65) Prior Publication Data
US 2018/0074113 A1    Mar. 15, 2018

(30) Foreign Application Priority Data

Nov. 16, 2015 (KR) .......................... 10-2015-0160566

(51) Int. Cl.
*G01R 31/12* (2006.01)
*G01R 31/36* (2019.01)
(Continued)

(52) U.S. Cl.
CPC ......... *G01R 31/1227* (2013.01); *G01R 27/02* (2013.01); *G01R 27/08* (2013.01); *G01R 31/14* (2013.01); *G01R 31/36* (2013.01)

(58) Field of Classification Search
CPC .... G01R 31/14; G01R 31/1227; G01R 31/36; G01R 27/02; G01R 27/08
See application file for complete search history.

(56) References Cited

U.S. PATENT DOCUMENTS 9,541,608 B2    1/2017   Hong et al.
10,067,176 B2 *  9/2018  Sung ..................... G01R 31/36
(Continued)

FOREIGN PATENT DOCUMENTS

CN    102362185 A    2/2012
CN    103250061 A    8/2013
(Continued)

OTHER PUBLICATIONS

International Search Report, issued PCT/KR2016/013185, dated Feb. 20, 2017.
(Continued)

*Primary Examiner* — Dominic E Hawkins
(74) *Attorney, Agent, or Firm* — Birch, Stewart, Kolasch & Birch, LLP

(57) ABSTRACT

The present invention relates to an insulation resistance measuring system and device which calculate resistance values of the positive electrode insulation resistance and the negative electrode insulation resistance by using convergence values of the first voltage and the second voltage, in order to measure the positive electrode insulation resistance and the negative electrode insulation resistance connected to both terminals of a battery pack with a capacitor, respectively.

6 Claims, 4 Drawing Sheets

(51) Int. Cl.
*G01R 27/02* (2006.01)
*G01R 27/08* (2006.01)
*G01R 31/14* (2006.01)

(56) References Cited

U.S. PATENT DOCUMENTS

| | | |
|---|---|---|
| 2004/0189330 A1 | 9/2004 | Herb et al. |
| 2011/0140714 A1 | 6/2011 | Hernando et al. |
| 2012/0016613 A1 | 1/2012 | Yang et al. |
| 2013/0176041 A1 | 7/2013 | Yang |
| 2013/0314097 A1* | 11/2013 | Hausberger ............ B60L 3/0069 324/503 |
| 2014/0084933 A1 | 3/2014 | Jang et al. |
| 2014/0095093 A1* | 4/2014 | Hong ................ G01R 31/1227 702/63 |
| 2014/0159908 A1* | 6/2014 | Hong ................ G01R 31/025 340/636.1 |
| 2014/0333321 A1* | 11/2014 | Kawamura ............ B60L 3/0069 324/509 |
| 2019/0100104 A1* | 4/2019 | Kawamura ............ B60L 3/0069 |

FOREIGN PATENT DOCUMENTS

| | | |
|---|---|---|
| JP | 2004-219414 A | 8/2004 |
| JP | 2004-325382 A | 11/2004 |
| JP | 2006-343267 A | 12/2006 |
| JP | 2014-522966 A | 9/2014 |
| KR | 10-2013-0109066 A | 10/2013 |
| KR | 10-2013-0127828 A | 11/2013 |
| KR | 10-2013-0128597 A | 11/2013 |
| KR | 10-1361285 B1 | 2/2014 |

OTHER PUBLICATIONS

European Search Report for Appl. No. 16866639.4 dated Jun. 7, 2018.

\* cited by examiner

[Figure 1]
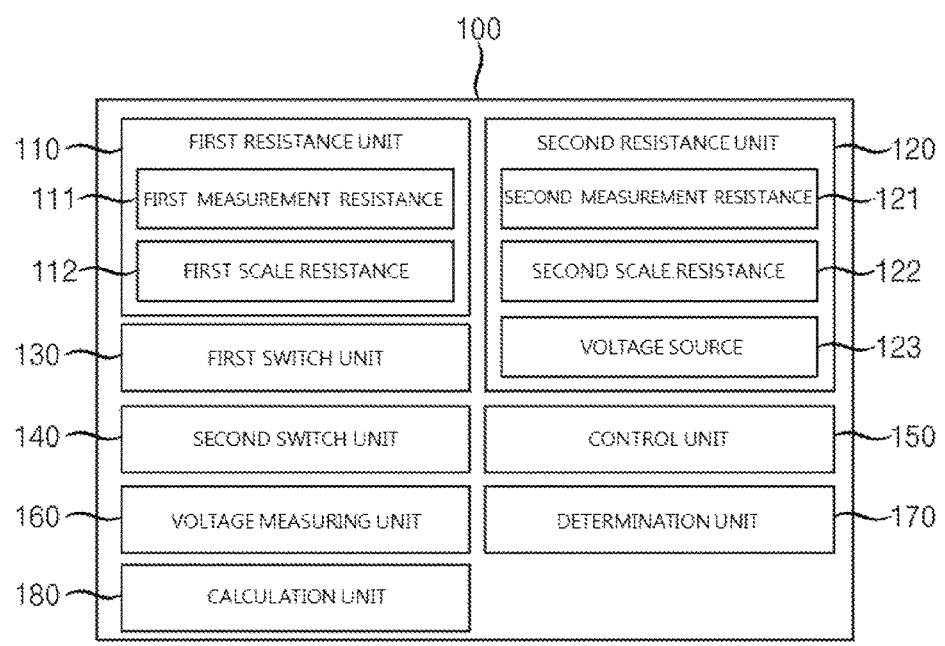

[Figure 2]
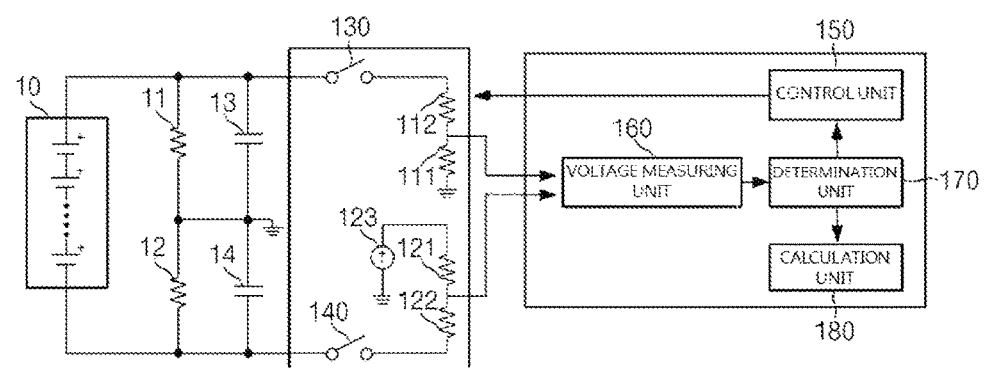

[Figure 3]
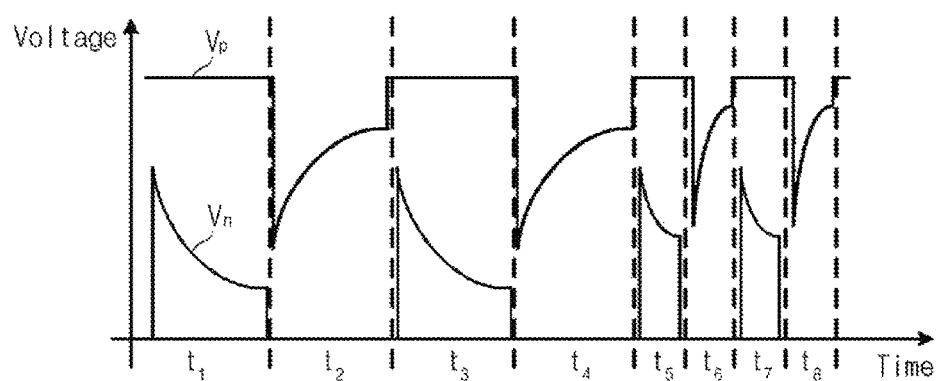

[Figure 4]
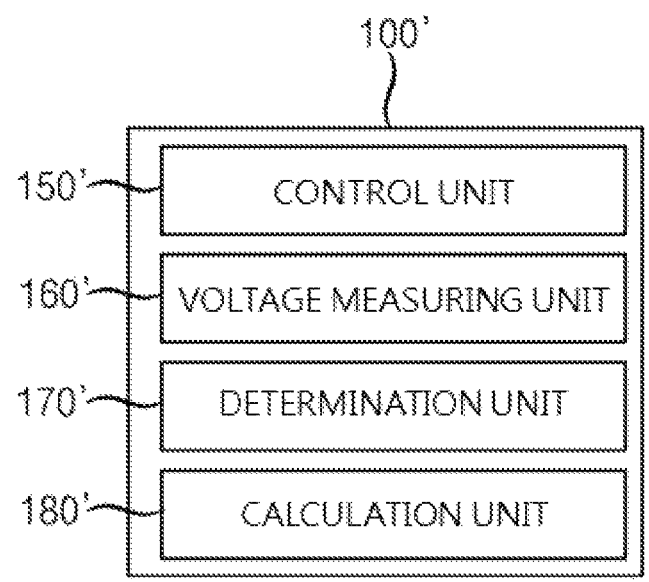

INSULATION RESISTANCE MEASURING SYSTEM AND DEVICE

TECHNICAL FIELD

This application claims priority to and the benefit of Korean Patent Application No. 10-2015-0160566 filed in the Korean Intellectual Property Office on Nov. 16, 2015, the entire contents of which are incorporated herein by reference.

The present invention relates to an insulation resistance measuring system and device, and more particularly, to an insulation resistance measuring system and device which determine whether first voltage of a first measurement resistance connected with a positive electrode insulation resistance in parallel and second voltage of a second measurement resistance connected with a negative electrode insulation resistance in parallel converge, respectively, control connection between the positive electrode insulation resistance and the negative electrode insulation resistance and the first and second measurement resistances according to whether the first voltage and the second voltage converge, respectively, and calculate resistance values of the positive electrode insulation resistance and the negative electrode insulation resistance by using convergence values of the first voltage and the second voltage, in order to measure the positive electrode insulation resistance and the negative electrode insulation resistance connected to both terminals of a battery pack with a capacitor, respectively.

BACKGROUND ART

An energy storage system (ESS), an electric vehicle (EV), and the like, which use a high-voltage battery pack, are equipped with a system that automatically interrupts power when an emergency situation occurs. The "emergency situation" refers to an excessive short circuit, insulation breakdown, etc., which are caused by aging of an associated component, and an excessive short circuit, insulation breakage, etc., which are caused by a short circuit caused by component breakage due to an external impact.

When an emergency situation occurs, a command for interrupting main power is transmitted from a higher-order component for controlling high-voltage components such as a battery management system (BMS) or a hybrid control unit (HCU), thereby controlling the power. The high-voltage associated component monitors voltage and current of a line connecting the power through a series of programs or sensors, and interrupts the main power through CAN communication or signal transmission when voltage and current, which are out of a normal range, are detected or there occurs leakage current, which is equal to or higher than an allowable value, and when there occurs insulation resistance breakage, which is equal or higher than the allowable value.

As described above, it is very important to measure insulation resistance in the ESS, the EV, and the like using the high-voltage battery pack. Examples of a method for measuring the leakage current of the battery pack include a method of forcing direct current (DC) to flow by breaking insulation, and such a method has a disadvantage in that the insulation is broken while the insulation resistance is measured.

There is a method of measuring an insulation resistance component by connecting a capacitor to a battery pack and applying an AC signal to the capacitor in order to solve the disadvantage. However, the method also has a disadvantage in that since current charging the capacitor and discharged current need to pass through the same circuit, there are a lot of limits in designing the circuit.

Further, when a voltage measurement time for measuring the insulation resistance is delayed due to a delay of voltage falling and rising by a capacitor component, such that the insulation breakage occurs, there is a problem in that the insulation breakage cannot be rapidly detected.

Therefore, in order to solve the aforementioned problem, the present inventors have invented an insulation resistance measuring system and device, which determine whether first voltage of a first measurement resistance connected with a positive electrode insulation resistance in parallel and second voltages of second measurement resistances connected with a negative electrode insulation resistance in parallel converge, respectively, control connection of the positive electrode insulation resistance and the negative electrode insulation resistance and the first and second measurement resistances according to whether the first and second voltages converge, respectively, and calculate resistance values of the positive electrode insulation resistance and the negative electrode insulation resistance by using convergence values of the first and second voltages.

PRIOR ART DOCUMENT

[Patent Document]
Korean Patent Unexamined Publication No. 10-2012-0136211

DETAILED DESCRIPTION OF THE INVENTION

Technical Problem

The present invention is contrived to solve the problem and an object of the present invention is to provide an insulation resistance measuring system and device, which can rapidly detect insulation breakage by determining whether voltage of measurement voltage connected to the insulation resistance in parallel converges when insulation breakage occurs due to a delay of voltage falling and rising by a capacitor provided in a battery packet.

Technical Solution

A system for measuring insulation resistance according to an exemplary embodiment of the present invention includes: a first resistance unit which is connected with a positive electrode insulation resistance in parallel; a first switch unit which applies current to the positive electrode insulation resistance and the first resistance unit or interrupts the positive electrode insulation resistance and the first resistance unit; a second resistance unit which is connected with the negative electrode insulation resistance in parallel; a second switch unit which applies the current to the negative electrode insulation resistance and the second resistance unit or interrupts the negative electrode insulation resistance and the second resistance unit; a determination unit which determines whether first voltage and second voltage converge, respectively, based on change values of the first voltage and the second voltage applied to the first resistance unit and the second resistance unit, respectively; a control unit which controls the first and second switch units in response to whether the first voltage and the second voltage converge, respectively; and a calculation unit which calculates a resistance value of each of the positive electrode insulation resistance and the negative electrode insulation resistance by using convergence values of the first voltage and the second voltage.

The first resistance unit may include: a first measurement resistance; and a first scale resistance which is connected with the first measurement resistance in series and has a resistance value of a predetermined resistance ratio to the resistance value of the first measurement resistance.

The second resistance unit may include: a second measurement resistance; and a second scale resistance which is connected with the second measurement resistance in series and has a resistance value of a predetermined resistance ratio to the resistance value of the second measurement resistance.

The insulation resistance apparatus may further include a voltage measuring unit which measures voltage applied between the first measurement resistance and a ground to output the measured voltage as the first voltage and measures voltage applied between the second measurement resistance and the ground to output the measured voltage as the second voltage.

The determination unit may determine that the first voltage converges when the change value of the first voltage is equal to or less than a predetermined change value.

The control unit may turn off the first switch unit and turn on the second switch unit when it is determined that the first voltage converges according to the determination result of the determination unit.

The determination unit may determine that the second voltage converges when the change value of the second voltage is equal to or less than the predetermined change value.

The control unit may turn off the second switch unit and turn on the first switch unit when it is determined that the second voltage converges according to the determination result of the determination unit.

An apparatus for measuring insulation resistance according to an exemplary embodiment of the present invention includes: a determination unit which determines whether first voltage and second voltage converge, respectively, based on change values of the first voltage and the second voltage applied to a first resistance unit connected with the positive electrode insulation resistance in parallel and a second resistance unit connected with the negative electrode insulation resistance in parallel, respectively; a control unit which controls a first switch applying current to the positive electrode insulation resistance or interrupting the positive electrode insulation resistance and the first resistance unit and a second switch unit applying the current to the negative electrode insulation resistance and the second resistance unit or interrupting the negative electrode insulation resistance and the second resistance unit, in response to whether the first voltage and the second voltage converge, respectively; and a calculation unit which calculates a resistance value of each of the positive electrode insulation resistance and the negative electrode insulation resistance by using convergence values of the first voltage and the second voltage.

The apparatus for measuring insulation resistance may further include a voltage measuring unit which measures voltage applied between a first measurement resistance included in the first resistance unit and a ground to output the measured voltage as the first voltage and measures voltage applied between a second measurement resistance included in the second resistance unit and the ground to output the measured voltage as the second voltage.

The determination unit may determine that the first voltage converges when the change value of the first voltage is equal to or less than a predetermined change value.

The control unit may turn off the first switch unit and turn on the second switch unit when it is determined that the first voltage converges according to the determination result of the determination unit.

The determination unit may determine that the second voltage converges when the change value of the second voltage is equal to or less than the predetermined change value.

The control unit may turn off the second switch unit and turn on the first switch unit when it is determined that the second voltage converges according to the determination result of the determination unit.

Advantageous Effects

An insulation resistance measuring system and device according to the embodiments of the present invention has an effect in that an insulation resistance value is calculated by detecting that voltage of measurement resistance connected with the insulation resistance in parallel more rapidly converges than a normal state as insulation breakage occurs, thereby rapidly determining the insulation breakage.

Further, the present invention has an effect in which a measurement period of the insulation resistance can be shortened by not controlling electrical connection of the measurement resistance connected with the insulation resistance in parallel every predetermined period but controlling the electrical connection according to whether the voltage of the measurement resistance converges.

BRIEF DESCRIPTION OF DRAWINGS

FIG. 1 is a block diagram illustrating a configuration of a system for measuring insulation resistance according to an embodiment of the present invention.

FIG. 2 is a circuit diagram illustrating electrical connection of the system for measuring insulation resistance according to an embodiment of the present invention.

FIG. 3 is a graph illustrating first voltage and second voltage measured by a voltage measuring unit according to the time.

FIG. 4 is a block diagram illustrating a configuration of an apparatus for measuring insulation resistance according to an embodiment of the present invention.

BEST MODE

The present invention will be described below in detail with reference to the accompanying drawings. Herein, the repeated description and the detailed description of publicly-known function and configuration that may make the gist of the present invention unnecessarily ambiguous will be omitted. Embodiments of the present invention are provided for more completely describing the present invention to those skilled in the art. Accordingly, shapes, sizes, and the like of elements in the drawings may be exaggerated for clearer explanation.

Throughout the specification, unless explicitly described to the contrary, a case where any part "includes" any component will be understood to imply the inclusion of stated components but not the exclusion of any other component.

In addition, the term "unit" disclosed in the specification means a unit that processes at least one function or operation, and the unit may be implemented by hardware or software or a combination of hardware and software.

FIG. 1 is a block diagram illustrating a configuration of a system 100 for measuring insulation resistance according to an embodiment of the present invention, and FIG. 2 is a circuit diagram illustrating electrical connection of an apparatus for measuring insulation resistance according to the embodiment of the present invention.

Referring to FIGS. 1 and 2, the insulation resistance measuring system 100 may include a first resistance unit 110, a second resistance unit 120, a first switch unit 130, a second switch unit 140, a control unit 150, a voltage measuring unit 160, a determination unit 170, and a calculation unit 180. The insulation resistance measuring system 100 illustrated in FIGS. 1 and 2 is just an embodiment, and the constituent elements thereof are not limited to the embodiment illustrated in FIGS. 1 and 2, and as necessary, the constituent elements may be added, modified, or deleted.

The insulation resistance measuring system 100 according to the exemplary embodiment of the present invention may measure a positive electrode insulation resistance 11 and a negative electrode insulation resistance 12 connected to a positive electrode (+) and a negative electrode (−) of a battery pack, respectively. In this case, a positive electrode capacitor 13 and a negative electrode capacitor 14 may be connected to the positive electrode insulation resistance 11 and the negative electrode insulation resistance 12, respectively, in parallel. As a result, a delay of voltage falling and rising may occur in the positive electrode insulation resistance 11 and the negative electrode insulation resistance 12 due to the positive electrode capacitor 13 and the negative electrode capacitor 14.

The delay of the voltage falling and rising may be changed according to conditions such as whether voltage, current, and the insulation resistance of the battery pack are normal.

Therefore, the insulation resistance measuring system 100 according to the present invention may change measurement times of the positive electrode insulation resistance 11 and the negative electrode insulation resistance 12 in response to the delay of the voltage falling and rising.

To this end, the first resistance unit 110 may be connected with the positive electrode insulation resistance 11 in parallel, and the second resistance unit 120 may be connected with the negative electrode insulation resistance 12 in parallel.

In more detail, the first resistance unit 110 may include a first measurement resistance 111 and may further include a first scale resistance 112 connected with the first measurement resistance 111 in series.

In this case, a ratio of a resistance value of the first measurement resistance 111 and a resistance value of the first scale resistance 112 may be a predetermined resistance ratio.

Herein, the predetermined resistance ratio may be the ratio of the resistance value of the first measurement resistance 111 and the resistance value of the first scale resistance 112 set to lower and measure the voltage of a battery pack 10, which is applied to the first measurement resistance 111.

The second resistance unit 120 may include a second measurement resistance 121 and may further include a second scale resistance 122 connected with the second measurement resistance 121 in series.

In this case, a ratio of a resistance value of the second measurement resistance 121 and a resistance value of the second scale resistance 122 may be a predetermined resistance ratio.

Herein, the predetermined resistance ratio may be the ratio of the resistance value of the second measurement resistance 121 and the resistance value of the second scale resistance 122, which are set to lower and measure the voltage of the battery pack 10, which is applied to the second measurement resistance 121.

Meanwhile, the second resistance unit 120 may further include a voltage source 123 connected with the second measurement resistance 121 in series.

The voltage source 123 is connected between the second measurement resistance 121 and a ground to serve to apply the voltage so that the voltage applied between the second measurement resistance 121 and the ground has a positive value.

The first switch unit 130 may serve to apply current to the positive electrode insulation resistance 11 and the first resistance unit 110 or interrupts the positive electrode insulation resistance 11 and the first resistance unit 110, and the second switch unit 140 may serve to apply the current to the negative electrode insulation resistance 12 and the second resistance unit 120 or interrupts the negative electrode insulation resistance 12 and the second resistance unit 120.

In this case, the control unit 150 may control operation states of the first switch unit 130 and the second switch unit 140 to an on or off state.

The control unit 150 may control the first switch unit 130 to the on state and the second switch unit 140 to the off state at the time of an initial insulation resistance measurement.

Thereafter, the control unit 150 may serve to control the operation states of the first switch unit 130 and the second switch unit 140 in response to a determination result of the determination unit 170 to be described below. The control of the operation states of the first and second switch units 130 and 140 of the control unit 150 according to the determination result of the determination unit 170 will be described below.

The voltage measuring unit 160 may serve to measure the voltage applied between the first measurement resistance 111 and the ground and output the measured voltage as the first voltage.

Further, the voltage measuring unit 160 may serve to measure the voltage applied between the second measurement resistance 121 and the ground and output the measured voltage as the second voltage.

To this end, the voltage measuring unit 160 may further include an AD converter that converts an analog voltage signal into a digital voltage signal. Herein, the digital voltage signal may be a digital signal acquired by outputting the voltage value according to the time by a graph.

FIG. 3 is a graph illustrating first voltage $V_p$ and second voltage $V_n$ measured by the voltage measuring unit 160 according to the time.

Referring to FIG. 3, during intervals of $t_1$, $t_3$, $t_5$, and $t_7$, when the first switch unit 130 is controlled to the on state and the second switch unit 140 is controlled to the off state, the voltage measured by the voltage measuring unit 160 may be the first voltage $V_p$ and the second voltage $V_n$.

In more detail, when the first switch unit 130 is controlled to the on state and the second switch unit 140 is controlled to the off state, the first measurement resistance 111 is connected with the battery pack 10, the first voltage rises, and then the first voltage may converge to predetermined voltage due to the positive electrode capacitor 13.

On the contrary, during intervals of $t_2$, $t_4$, $t_6$, and $t_8$, when the second switch unit 140 is controlled to the on state and the first switch unit 130 is controlled to the off state, the voltage measured by the voltage measuring unit 160 may be the first voltage and the second voltage.

When the second switch unit 140 is controlled to the on state and the first switch unit 130 is controlled to the off state, the second measurement resistance 121 is connected with the battery pack 10, the second voltage falls from the voltage boosted from the voltage source 123, and then the second voltage may converge to predetermined voltage due to the negative electrode capacitor 14.

The intervals of $t_5$ to $t_8$ may be the first voltage and the second voltage measured from the voltage measuring unit 160 at the time when the insulation resistance is broken.

When the insulation resistance is broken, magnitudes of the voltages, which are applied to the first measurement resistance 111 and the second measurement resistance 121 connected with the positive electrode insulation resistance 13 and the negative electrode insulation resistance 14, respectively, in parallel, may increase.

As a result, after the first switch unit 130 and the second switch unit 140 are changed to the on or off state, the first voltage and the second voltage may converge to predetermined voltage earlier than the case where the insulation resistance is in the normal state.

The determination unit 170 may serve to determine whether the first voltage and the second voltage measured by the voltage measuring unit 160 converges, respectively.

In more detail, the determination unit 170 may determine whether the first voltage and the second voltage converge, respectively, based on change values of the first voltage and the second voltage and transmit a determination result to the control unit 150 and the calculation unit 180 to be described below.

In order to determine whether the first voltage converges, the determination unit 170 compares the change value of the first voltage with a predetermined change value, and when the change value of the first voltage is equal to or less than the predetermined change value, the determination unit 170 may determine that the first voltage converges.

Similarly thereto, in order to determine whether the second voltage converges, the determination unit 170 compares the change value of the second voltage with a predetermined change value, and when the change value of the second voltage is equal to or less than the predetermined change value, the determination unit 170 may determine that the second voltage converges.

Herein, the change values of the first voltage and the second voltage may be voltage values in which the first voltage and the second voltage are changed per unit time, and the predetermined change value may be a criterion value for determining that the voltage change ends as the delay of the voltage falling and rising ends due to the capacitor 13 in the case of the first voltage and the second voltage.

When it is determined that the first voltage converges according to the determination result of the determination unit 170, the control unit 150 may turn off the first switch unit 130 and turn on the second switch unit 140.

On the contrary, when it is determined that the second voltage converges according to the determination result of the determination unit 170, the control unit 150 may turn off the second switch unit 140 and turn on the first switch unit 130.

Therefore, the control unit 150 does not previously set a period of changing the on or off states of the first switch unit and the second switch unit but flexibly changes the period according to whether the first voltage and the second voltage converge, respectively, in order to measure the insulation resistance, thereby shortening a time required for measuring the insulation resistance.

The calculation unit 180 may calculate the resistance values of the positive electrode insulation resistance 11 and the negative electrode insulation resistance 12 by using the first voltage at the time when it is determined by the determination unit 170 that the first voltage converges, that is, the convergence value of the first voltage, the second voltage at the time when it is determined by the determination unit 170 hat the second voltage converges, that is, the convergence value of the second voltage, and the voltage of the battery pack 10 at the calculation time.

In this case, the voltage of the battery pack 10 may be received from a battery management system (BMS) managing the battery pack.

FIG. 4 is a block diagram illustrating a configuration of an apparatus 100' for measuring insulation resistance according to an embodiment of the present invention.

Referring to FIG. 4, the insulation resistance measuring apparatus 100' may include a control unit 150', a voltage measuring unit 160', a determination unit 170', and a calculation unit 180'. When the insulation resistance measuring system 100 illustrated in FIGS. 1 and 2 and the insulation resistance measuring apparatus 100' illustrated in FIG. 4 are compared with each other, the insulation resistance measuring apparatus 100' does not include only the first resistance unit 110, the second resistance unit 120, the first switch unit 130, and the second switch unit 140 of the insulation resistance measuring system 100, and may include the control unit 150', the voltage measuring unit 160', the determination unit 170', and the calculation unit 180', which play the same roles as the control unit 150, the voltage measuring unit 160, the determination unit 170, and the calculation unit 180.

Therefore, as described above, since the control unit 150', the voltage measuring unit 160', the determination unit 170', and the calculation unit 180' of the insulation resistance measuring apparatus 100' are components that play the same roles as the control unit 150, the voltage measuring unit 160, the determination unit 170, and the calculation unit 180 of the insulation resistance measuring system 100, a repeated description will be omitted.

Meanwhile, the insulation resistance measuring apparatus 100' is connected to the battery pack 10, which previously includes the first resistance unit 110, the second resistance unit 120, the first switch unit 130, and the second switch unit 140 of the insulation resistance measuring system 100, thereby measuring the insulation resistance of the battery pack 10.

The present invention has been described with reference to the preferred embodiments, but those skilled in the art will understand that the present invention can be variously modified and changed without departing from the spirit and the scope of the present invention which are defined in the appended claims.

EXPLANATION OF REFERENCE NUMERALS AND SYMBOLS

100: Insulation resistance measuring system
100': Insulation resistance measuring apparatus
110: First resistance unit
111: First measurement resistance
112: First scale resistance
120: First resistance unit
121: Second measurement resistance 122: Second scale resistance
123: Voltage source
130: First switch unit
140: Second switch unit
150: Control unit
160: Voltage measuring unit
170: Determination unit
180: Calculation unit

The invention claimed is:

1. A system for measuring insulation resistance, which measures a positive electrode insulation resistance and a negative electrode insulation resistance connected to both terminals of a battery pack, respectively, the system comprising:
a first resistance unit which is connected with the positive electrode insulation resistance in parallel;
a first switch unit which applies current to the positive electrode insulation resistance and the first resistance unit or interrupts the positive electrode insulation resistance and the first resistance unit;
a second resistance unit which is connected with the negative electrode insulation resistance in parallel;
a positive electrode capacitor connected to the positive insulation resistance in parallel;
a negative electrode capacitor connected to the negative insulation resistance in parallel;
a second switch unit which applies the current to the negative electrode insulation resistance and the second resistance unit or interrupts the negative electrode insulation resistance and the second resistance unit;
a control unit which controls the first and second switch units in response to whether a first voltage and a second voltage converge, respectively; and
a calculation unit which calculates a resistance value of each of the positive electrode insulation resistance and the negative electrode insulation resistance by using convergence values of the first voltage and the second voltage,
wherein the system is configured to:
during a first interval, control the first switch to an on state and control the second switch to an off state, via the control unit, to cause the first voltage to converge to a predetermined voltage due to the positive electrode capacitor, wherein a determination unit determines whether the first voltage converges by comparing a change value of the first voltage with a predetermined change value, and when the change value of the first voltage is equal to or less than the predetermined change value, the determination unit determines that the first voltage converges,
during a second interval immediately after the first interval, control the first switch to an off state and control the second switch to an on state, via the control unit, to cause the second voltage to converge to a predetermined voltage due to the negative electrode capacitor, wherein the determination unit determines whether the second voltage converges by comparing a change value of the second voltage with a predetermined change value, and when the change value of the second voltage is equal to or less than the predetermined change value, the determination unit determines that the second voltage converges,
compare the first and second intervals to a predetermined interval, and
in response to the first interval or second interval being less than the predetermined interval, interrupting power from the battery pack.

2. The system of claim 1, wherein the first resistance unit includes:
a first measurement resistance; and
a first scale resistance which is connected with the first measurement resistance in series and has a resistance value of a predetermined resistance ratio to the resistance value of the first measurement resistance.

3. The system of claim 2, wherein the second resistance unit includes:
a second measurement resistance; and
a second scale resistance which is connected with the second measurement resistance in series and has a resistance value of a predetermined resistance ratio to the resistance value of the second measurement resistance.

4. The system of claim 3, further comprising:
a voltage measuring unit which measures voltage applied between the first measurement resistance and a ground to output the measured voltage as the first voltage and measures voltage applied between the second measurement resistance and the ground to output the measured voltage as the second voltage.

5. An apparatus for measuring insulation resistance, which measures a positive electrode insulation resistance and a negative electrode insulation resistance connected to both terminals of a battery pack, respectively, the apparatus comprising:
a positive electrode capacitor connected to the positive insulation resistance in parallel;
a negative electrode capacitor connected to the negative insulation resistance in parallel;
a first resistance unit connected with the positive electrode insulation resistance in parallel and a second resistance unit connected with the negative electrode insulation resistance in parallel, respectively;
a control unit which controls a first switch applying current to the positive electrode insulation resistance and the first resistance unit or interrupting the positive electrode insulation resistance and the first resistance unit and a second switch unit applying the current to the negative electrode insulation resistance and the second resistance unit or interrupting the negative electrode insulation resistance and the second resistance unit, in response to whether a first voltage and a second voltage converge, respectively; and
a calculation unit which calculates a resistance value of each of the positive electrode insulation resistance and the negative electrode insulation resistance by using convergence values of the first voltage and the second voltage,
wherein the apparatus is configured to:
during a first interval, control the first switch to an on state and control the second switch to an off state, via the control unit, to cause the first voltage to converge to a predetermined voltage due to the positive electrode capacitor, wherein a determination unit determines whether the first voltage converges by comparing a change value of the first voltage with a predetermined change value, and when the change value of the first voltage is equal to or less than the predetermined change value, the determination unit determines that the first voltage converges,
during a second interval immediately after the first interval, control the first switch to an off state and control the second switch to an on state, via the control unit, to cause the second voltage to converge to a predetermined voltage due to the negative electrode capacitor, wherein the determination unit determines whether the second voltage converges by comparing a change value of the second voltage with a predetermined change value, and when the change value of the second voltage is equal to or less than the predetermined change value, the determination unit determines that the second voltage converges, compare the first and second intervals to a predetermined interval, and in response to the first interval or second interval being less than the predetermined interval, interrupting power from the battery pack.

6. The apparatus of claim 5, further comprising:

a voltage measuring unit which measures voltage applied between a first measurement resistance included in the first resistance unit and a ground to output the measured voltage as the first voltage and measures voltage applied between a second measurement resistance included in the second resistance unit and the ground to output the measured voltage as the second voltage.

* * * * *